United States Patent [19]

Asano

[11] Patent Number: 5,409,867

[45] Date of Patent: Apr. 25, 1995

[54] METHOD OF PRODUCING POLYCRYSTALLINE SEMICONDUCTOR THIN FILM

[75] Inventor: Akihiko Asano, Kanagawa, Japan

[73] Assignee: Fuji Electric Co., Ltd., Kanagawa, Japan

[21] Appl. No.: 260,304

[22] Filed: Jun. 15, 1994

[30] Foreign Application Priority Data

Jun. 16, 1993 [JP] Japan ................... 5-144111

[51] Int. Cl.⁶ .................. H01L 21/469; H01L 21/20
[52] U.S. Cl. .................... 437/233; 437/109; 437/173; 148/DIG. 48; 148/DIG. 71; 117/8; 117/45; 117/904; 117/905
[58] Field of Search .............. 117/8, 45, 106, 904, 117/905, 923; 148/DIG. 1, DIG. 25, DIG. 48, DIG. 71; 437/109, 114, 233, 943, 173

[56] References Cited

U.S. PATENT DOCUMENTS

| 4,234,358 | 11/1980 | Celler et al. ................... 117/8 |
| 4,379,020 | 4/1987 | Glaeser et al. ............ 148/DIG. 1 |
| 4,498,951 | 2/1985 | Tamura et al. ................. 117/45 |
| 4,559,102 | 12/1985 | Hayafuji ....................... 117/45 |
| 4,581,620 | 4/1986 | Yamazaki et al. ............. 136/244 |
| 4,599,133 | 7/1986 | Miyao et al. .................. 117/45 |
| 4,612,072 | 9/1986 | Morrison et al. ............. 117/106 |
| 4,657,603 | 4/1987 | Kruehler et al. .......... 148/DIG. 48 |
| 4,670,086 | 7/1987 | Leamy ........................ 117/45 |
| 4,843,031 | 6/1989 | Ban et al. ................ 148/DIG. 48 |
| 5,103,284 | 4/1992 | Ovshinsky et al. . |

FOREIGN PATENT DOCUMENTS 60-0728  1/1985  Japan ..................... 148/DIG. 48
5-226246 9/1993  Japan ............................ 117/8

OTHER PUBLICATIONS

Tsaur et al., "Improved techniques for growth of large-area single-crystal Si sheets over SiO$_2$ using lateral epitaxy by seeded solidification," Applied Physics Letters, vol. 39, No. 7, Oct. 1981, pp. 561–563.

Abe et al., "Silicon Crystal and Doping," pp. 108–115, 1986.

Kamins et al., "Structure and Stability of Low Pressure Chemically Vapor-Deposited Silicon Films," J. Electrochem. Soc., pp. 927–932, Jun. 1978.

Primary Examiner—Brian E. Hearn
Assistant Examiner—Leon Radomsky
Attorney, Agent, or Firm—Finnegan, Henderson, Farabow, Garrett & Dunner

[57] ABSTRACT

After partially crystallizing an amorphous semiconductor deposited on a substrate, the irradition of infrared ray is conducted to grow a polycrystalline semiconductor layer on the crystallized region and the amorphous region by thermal decomposition while the temperature of the crystallized region is kept higher than that of the amorphous region. Since the polycrystalline layer is formed of polycystalline grains grown from nuclei of the cystallized region, the crystal grain thereof is large.

8 Claims, 2 Drawing Sheets

METHOD OF PRODUCING POLYCRYSTALLINE SEMICONDUCTOR THIN FILM

BACKGROUND OF THE INVENTION

The present invention relates to a method of producing a polycrystalline semiconductor thin film such as a polycrystalline silicon thin film used as a raw semiconductor material for a semiconductor element or a wiring material.

For example, a low pressure CVD method, that is, a chemical vapor deposition method under a low pressure is known as a method of producing a polycrystalline silicon thin film. FIG. 2 is a conceptional view showing the low pressure CVD method. In the drawing, a quartz boat 23 having single crystal silicon substrates 11 vertically set thereon is disposed in a transparent quartz pipe 22 which is disposed in a tubular electric furnace 21, and the pipe is exhausted by a vacuum exhaustion pump through an exhaust port 24 and a valve 25. Then, the silicon substrates 11 are heated and silane ($SiH_4$) is introduced through an entrance port 26 and a valve 27. When the substrates are heated to a temperature more than a decomposition temperature of the silane, that is, up to 600°–620° C., the silane is heat-decomposed in a region near the substrates 11 so that a polycrystalline silicon thin film is deposited on the substrate 11. In this case, although the silane is decomposed when a substrate heating temperature becomes 450° C., an amorphous silicon thin film is deposited in the range of 450°–600° C.

However, the grain size of the thus grown polycrystalline silicon is so small as to be about 1 μm or less and defects of a high density exist in grain boundaries. Thus, although it has been merely used as a wiring material of an integrated circuit, it has a problem that when it is used for an active region of a semiconductor element such as a diode and a transistor, that is, when it is used for a raw material for forming a junction, the chracteristics of the element are inferior. The reason why the crystalline grains are small, is that since crystalline nuclei as the origin of crystal growth are formed in various portions of the substrate, the number of crystals is large and when they grow into a size of some largeness, they can not grow further by disturbance of other crystal grains.

SUMMARY OF THE INVENTION

In view of the above, an object of the present invention is to provide a method of producing a polycrystalline semiconductor thin film which has a large grain size and can be used as a material for an active region of a semiconductor element.

In order to achieve the above object, a method of producing a polycrystalline semiconductor thin film according to the present invention comprises the steps of depositing an amorphous semiconductor thin film on a substrate, partially crystallizing the amorphous semiconductor thin film by irradiation of light to a plurality of regions separated from each other with substantially the same distance, and growing a polycrystalline layer by thermal decomposition of a compound gas on the entire region of the crystallized region and the amorphous region while the temperature of the crystallized region is kept higher than that of the amorphous region. The infrared ray or visible ray may be used as the light for partially crystallizing the amorphous semiconductor thin film. In order to keep the temperature of the crystallized region higher than that of the amorphous region, the entire region may be irradiated with the infrared ray. It is preferable that the semiconductor substrate is silicon.

When the amorphous semiconductor thin film is crystallized while the temperature of the crystallized region is kept higher than that of the amorphous region and then a polycrystalline layer is grown by thermal decomposition on the entire region, the crystallized region of a high temperature becomes a nucleus and a polycrystalline semiconductor thin film having crystal grains of a low surface density can be formed, so that the largeness of crystal grains can be increased. Since the crystallized region has an absorption coefficient for infrared ray much greater than that of the amorphous region, it is easy to keep the temperature of the crystallized region higher than that of the amorphous region by irradiating the entire region with the infrared ray.

DETAILED DESCRIPTION OF THE PREFERRED EMBODIMENTS

Figure 1A:
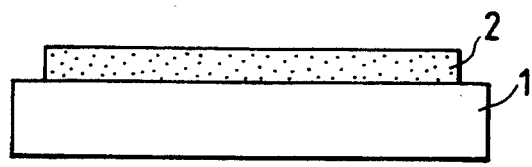
FIGS. 1(a) to 1(e) are sectional views showing sequentially steps of producing a polycrystalline silicon thin film according to an embodiment of the present invention.

Preferred embodiments of a method of producing a polycrystalline semiconductor thin film according to the present invention will be described in detail with reference to the accompanying drawings.

FIGS. 1(a)–1(e) are views showing conception of a method of producing a polycrystalline silicon thin film on a transparent quartz glass substrate according to an embodiment of the present invention. First, after a transparent quartz glass substrate 1 was washed in an organic solvent such as acetone or methanol while being applied supersonic waves, the substrate was rinsed by deionized water and was dried. On this substrate 1, as shown in FIG. (a), by a plasma CVD method in which glow discharge is generated in silane gas, an amorphous silicon thin film 2 of about 0.5 μm thickness was grown. The growing conditions were that the substrate temperature was 250° C., flow rate of silane was 20 cc/second (converted value in a standard state), gas pressure in a reactive chamber was 50 Pa, and power density of the glow discharge was 15 $mW/cm^2$. Further, hydrogen as a diluting gas for silane was added at the flow rate of 20 cc/second (converted value in a standard state). Under these conditions, the growing rate of the amorphous silicon was 0.3 nm/second. Then, the sample including the thus grown amorphous silicon thin film was disposed on a movable stage of XY two axes. As shown in FIG. 2(b), while the substrate 1 was moved in the direction of arrow 3 and in the direction normal thereto, it was irradiated with a light beam 4 which was an optical pulse of the second harmonic (wavelength 0.532 μm) of a Q switch pulse oscillation type YAG laser condensed by a convex lens and passed through a slit, so that the regions 5 of 10 μm×10 μm separated from each other with the length and width of 50 μm were crystallized. The irradiation conditions of the laser beam were that the strength was 2 $J/cm^2$, the pulse width was 145 ns, and the repetition frequency was 7 kHz.

Figure 1B:
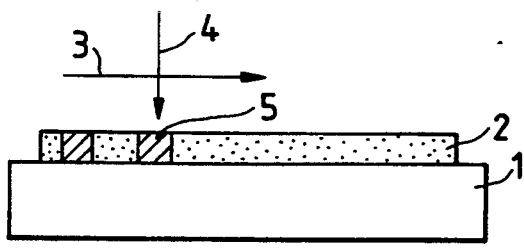
Figure 1C:
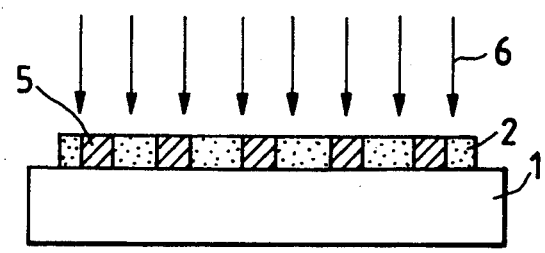
Figure 1D:
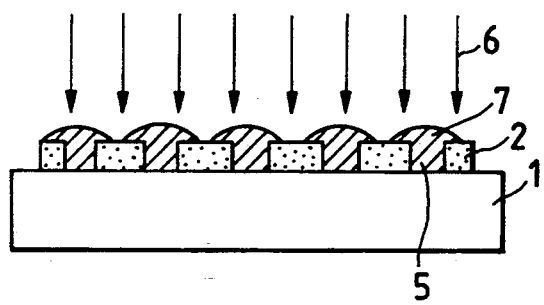
Figure 1E:
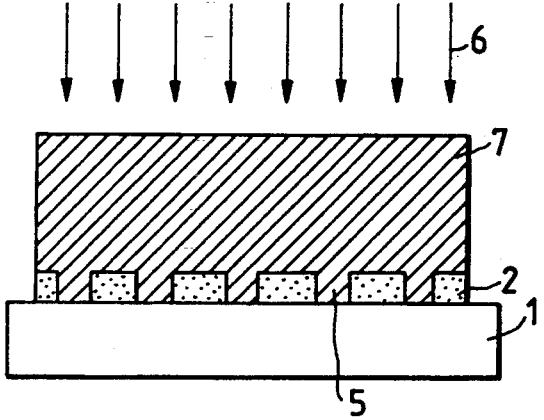
Figure 2:
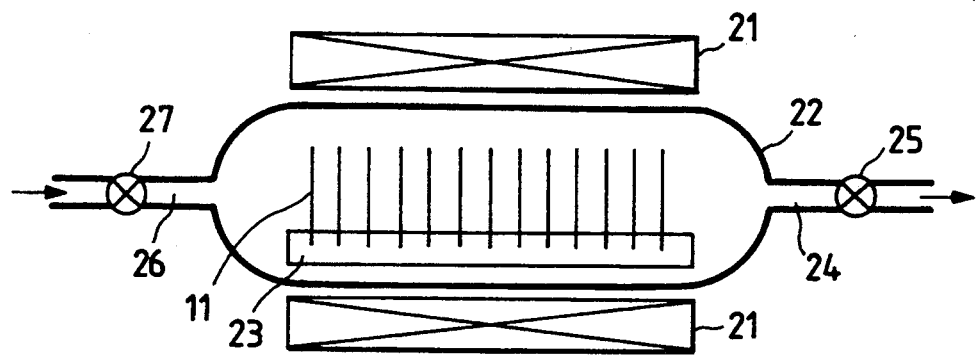
FIG. 2 is a sectional view showing a conventional apparatus for producing a polycrystalline silicon thin film.

Next, the sample including the partially crystallized regions 5 as shown in FIG. 1(b) was inserted into an infrared lamp heating furnace, and the entire surface was irradiated, in silane of gas pressure 100 Pa, with infrared rays 6 from an infrared lamp as shown in FIG. 1(c). An optical absorption coefficient for the infrared ray of wavelength 1.2 μm is $10^{-2}cm^{-1}$ for the polycrystalline silicon of the crystallized region 5, while it is 1 $cm^{-1}$ or less for the amorphous silicon of other region 2 which is smaller than the former by two orders or more, so that the crystallized regions 5 are selectively heated and the amorphous silicon region 2 is heated from heat conduction therefrom. By calculating the generated heat quantity using the optical absorption coefficient of the infrared ray of the amorphous silicon thin film and that of the polycrystalline silicon thin film, and solving a heat conduction equation based on the heat quantity, it was found that the temperature of the crystallized region became about 630° C. by the infrared ray having the intensity by which the temperature of the substrate and the amorphous region became about 550° C. Practically, under the conditions in which the temperature of the amorphous region became about 500° C., as shown in FIG. 1(d), it was observed that a polycrystalline silicon thin film 7 grew by a partial thermal CVD. The thermal CVD was observed only in the regions 5 which were crystallized by the optical pulse from the YAG laser. That is, it was observed that selective crystal growth occurred while the crystallized regions were served as the nuclei of crystal growth. As the polycrystalline silicon grows, the area of the amorphous silicon decreases and the area of polycrystalline silicon increases, so that an average absorption quantity of the infrared ray by the sample increases and the temperature of the substrate increases. Thus, the temperature of the substrate was measured by using an infrared radiation thermometer, so that the strength of the infrared ray was feedback controlled. In this way, as shown in FIG. 1(e), the polycrystalline silicon thin film 7 of about 50 μm thickness grew on the entire surface of the amorphous silicon thin film 2. The polycrystalline silicon thin film 7 was observed by an optical microscope, and very large crystal grains with an average grain size of about 50 μm were observed. That is, it was found that according to the present invention, the grain size of the polycrystalline silicon thin film was remarkably increased as compared with the conventional method.

In the above embodiment, the transparent quartz substrate 1 was used. However, other substrate may be used if it has no crystal nuclei of Si on the surface, the thermal expansion coefficient thereof is near that of silicon, and the heat conductivity is low. For example, the similar results can be obtained even if the substrate is such that a $SiO_2$ thin film is formed by thermal CVD on a single crystal silicon substrate, or a $SiO_2$ thin film is formed by thermal CVD on a metal level silicon substrate which is much lower in purity but much cheaper than a semiconductor level one. However, since the temperature difference between the crystallized region and amorphous region can be large for a substrate having a low absorption quantity of infrared ray, it is preferable to use the single crystal silicon substrate.

Further, as the optical pulse for partially crystallizing the amorphous silicon thin film, even if the visible ray from a continuous-wave type laser, for example, the visible ray of wavelength 515 nm from an argon ion laser or the visible ray of wavelength 488 nm shorter than the former is used as it is or after it is chopped to be converted to intermittent rays, the similar results can be obtained. In this case, according to the continuous ray, contrary to the above described embodiment, the amorphous silicon layer is linearly crystallized. It is needless to say that the wavelength of a used laser beam is such that an optical absorption coefficient at the amorphous region is large.

Instead of the irradiation of infrared ray 6 shown in FIG. 1(c), an energy beam may be partially applied to the crystallized region 5 to heat the region. In this case, as the crystallized region 5 is enlarged, the region of irradiation must be extended.

According to the present invention, an amorphous semiconductor thin film is partially crystallized by light irradiation, and the crystallized region is selectively heated to a temperature over the thermal decomposition temperature of a raw material compound gas to conduct the selective thermal CVD, so that a semiconductor thin film formed of large polycrystals grown from nuclei of the crystallized region can be obtained. Thus, it is possible to produce a polycrystalline semiconductor thin film which can be used as a raw material for an active region of a semiconductor element.

What is claimed is:

1. A method of producing a polycrystalline semiconductor thin film, comprising the steps of:
   depositing an amorphous semiconductor thin film on a substrate;
   partially crystallizing said amorphous semiconductor thin film by irradiation of light to a plurality of regions of said amorphous semiconductor thin film separated from each other with a substantially same distance; and
   growing a polycrystalline layer by thermal decomposition of a compound gas on an entire surface of crystallized regions and amorphous regions while a temperature of the respective crystallized regions is kept higher than that of the respective amorphous regions.

2. A method of producing a polycrystalline semiconductor thin film as claimed in claim 1, wherein said amorphous semiconductor thin film is partially crystallized by irradiation of an infrared ray.

3. A method of producing a polycrystalline semiconductor thin film as claimed in claim 1, wherein said amorphous semiconductor thin film is partially crystallized by irradiation of a visible ray.

4. A method of producing a polycrystalline semiconductor thin film as claimed in claim 1, the temperature of the respective crystallized regions is kept higher than that of the respective amorphous regions by irradiation of an infrared ray to the entire surface of the crystallized regions and the amorphous regions.

5. A method of producing a polycrystalline semiconductor thin film as claimed in claim 1, the temperature of the respective crystallized regions is kept higher than that of the respective amorphous regions by irradiation of an energy beam to the crystallized regions.

6. A method of producing a polycrystalline semiconductor thin film as claimed in claim 1, wherein said semiconductor thin film is made of silicon.

7. A method of producing a polycrystalline semiconductor thin film as claimed in claim 1, wherein the temperature of the respective crystallized regions is kept higher than a thermal decomposition temperature of said compound gas.

8. A method of producing a polycrystalline semiconductor thin film as claimed in claim 1, wherein said compound gas is made of silane.

* * * * *

UNITED STATES PATENT AND TRADEMARK OFFICE
CERTIFICATE OF CORRECTION

PATENT NO. : 5,409,867
DATED : April 25, 1995
INVENTOR(S) : Akihiko ASANO

It is certified that error appears in the above-indentified patent and that said Letters Patent is hereby corrected as shown below:

Abstract, Title Page, Line 8 "polycystalline" should read --polycrystalline--.

Abstract, Title Page, Line 9 "polycystalline" should read --polycrystalline--.

Abstract, Title Page, Line 10 "cystallized" to --crystallized--.

Abstract, Title page, line 10, "crystal" to --cystal--.

Signed and Sealed this

Thirty-first Day of October 1995

Attest:

BRUCE LEHMAN

Attesting Officer     Commissioner of Patents and Trademarks